United States Patent
Hiroshi

Patent Number: 4,766,095
Date of Patent: Aug. 23, 1988

[54] METHOD OF MANUFACTURING EPROM DEVICE

[75] Inventor: Okuaki Hiroshi, Tokyo, Japan

[73] Assignee: Oki Electric Industry Co., Ltd., Tokyo, Japan

[21] Appl. No.: 688,842

[22] Filed: Jan. 4, 1985

[51] Int. Cl.$^4$ .............. H01L 23/10; H01L 23/18
[52] U.S. Cl. ...................... 437/217; 437/219; 174/52 PE; 357/74
[58] Field of Search ............ 437/215, 216, 217, 218, 437/219, 220; 264/272.17; 174/52 PE; 357/72, 73, 74

[56] References Cited

U.S. PATENT DOCUMENTS

| | | | |
|---|---|---|---|
| 3,611,861 | 10/1971 | Schulze | 85/5 |
| 3,660,819 | 5/1972 | Bentchkowsky | 317/235 R |
| 4,326,214 | 4/1982 | Trueblood | 357/74 |
| 4,460,915 | 7/1984 | Engel | 357/74 |

FOREIGN PATENT DOCUMENTS

| | | | |
|---|---|---|---|
| 66172 | 6/1978 | Japan | 29/588 |
| 76867 | 5/1982 | Japan | 29/588 |
| 162352 | 10/1982 | Japan | 29/588 |
| 56442 | 4/1983 | Japan | 29/572 |

*Primary Examiner*—O. Chaudhuri
*Attorney, Agent, or Firm*—Wenderoth, Lind & Ponack

[57] ABSTRACT

A method of manufacturing an EPROM IC device encapsulated in a plastic-molded package having a window for passing ultraviolet rays therethrough. An EPROM IC chip is fixed to a chip mounting region of a lead frame. The EPROM IC chip is placed in a hollow container made of a material capable of passing ultraviolet rays therethrough. A resin material capable of passing ultraviolet rays therethrough is introduced into the hollow container. A resultant structure is encapsulated plastic material except a surface of the hollow container, above the EPROM IC chip.

2 Claims, 2 Drawing Sheets

METHOD OF MANUFACTURING EPROM DEVICE

BACKGROUND OF THE INVENTION

The present invention relates to a method of manufacturing an erasable programmable read-only memory (EPROM) device in which stored information can be erased by ultraviolet radiation.

EPROM IC devices have in recent years found wide uses in various electronic digital apparatuses.

Since information can be written in the EPROM and stored information can be erased from the EPROM by radiating ultraviolet rays, the user can easily vary a program stored in the EPROM.

The EPROM is composed of floating-gate MOS transistors capable of nonvolatile storage of information. U.S. Pat. No. 3,660,819 discloses in detail a floating-gate MOS transistor.

As shown in FIG. 1 of the accompanying drawings, an EPROM IC chip has conventionally been housed in a ceramic package having a window. Generally, the ceramic package comprises, as shown in FIG. 2, an alumina base plate 1, an IC lead frame having a mounting region 6 in which lead pins 3 and an IC chip 7 are connected, and an alumina base plate 2 having a window 11 for passing ultraviolet rays therethrough. These components of the package are sealed by a mass 4 of glass having a low melting point. The surface of the mounting region 6 is coated with a plated layer of gold.

The ceramic package for EPROM ICs has been disadvantageous in that a manufacturing process therefor has many steps resulting in an increased cost of the IC devices. Where the ceramic package is employed, pad electrodes of the IC chip and the lead pins 3 cannot be interconnected by gold wires since the melting point of sealing glass 4 is in the range of from 400° to 500° C. The pad electrodes of the IC chip and the lead pins 3 are interconnected in many cases by aluminum wires, which however tend to react with gold and becomes brittle. Therefore, as shown in FIG. 3, in order to ground the pad electrode 12 of the IC chip 7, it has been necessary for an aluminum wire 10 to be connected by way of the small silicon piece (ground dice) 9 on which an aluminum layer 8 is formed.

The wire bonding process using aluminum wires has a drawback in that the rate of bonding is slower than that in the wire bonding process using gold wires.

In case a ceramic package is employed for an EPROM IC, the package is likely to be broken by a shock. Where a number of such packages are mounted on a printed-circuit board, the resulting construction is highly heavy and cannot be handled with ease.

To solve the foregoing problems, it is proposed to encapsulate an IC chip in a plastic-molded package. For example, U.S. Pat. No. 3,611,061 discloses the techonology for molding an IC chip in a plastic package. However, if the disclosed technology is to be applied to an EPROM IC chip, the necessity of a window for passing ultraviolet rays therethrough has made it difficult to encapsulate the EPROM IC chip in a plastic-molded package.

SUMMARY OF THE INVENTION

It is an object of the present invention to provide a method of manufacturing an EPROM IC device encapsulated in a plastic-molded package having a window for passing ultraviolet rays therethrough.

According to the present invention, an EPROM IC device is manufactured by preparing an IC lead frame having a chip mounting region and a plurality of connecting leads, fixing an EPROM IC chip to a surface of the chip mounting region, connecting pad electrodes of the EPROM IC chip to the connecting leads of the IC lead frame with thin metal wires, placing the IC lead frame on a hollow container over an opening therein, the hollow container being made of a material capable of passing ultraviolet rays therethrough and having side walls and a bottom, with the EPROM IC chip and the thin metal wires being housed in the container, introducing a resin material capable of passing ultraviolet rays therethrough into the container to produce an assembled structure, placing the structure in a mold, and encapsulating the structure, except the surface of the bottom of the container, with an insulative resin material in the mold.

The above and other objects, features and advantages of the present invention will become more apparent from the following description when taken in conjunction with the accompanying drawings in which a preferred embodiment of the present invention is shown by way of illustrative example.

DETAILED DESCRIPTION

Figure 1:
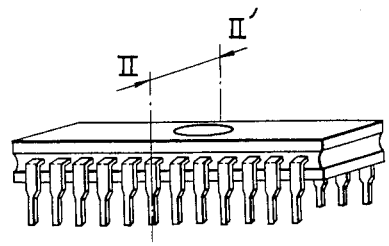
FIG. 1 is a perspective view of a conventional EPROM IC device housed in a ceramic package.
Figure 2:
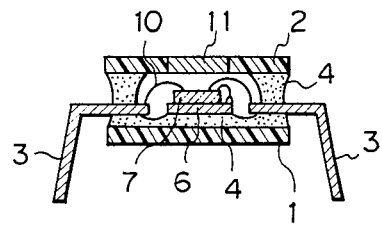
FIG. 2 is a cross-sectional view taken along line II—II' of FIG. 1.
Figure 3:
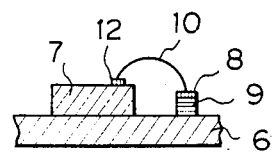
FIG. 3 is a fragmentary enlarged side elevational view of an IC chip mounting portion shown in FIG. 2.
Figure 4:
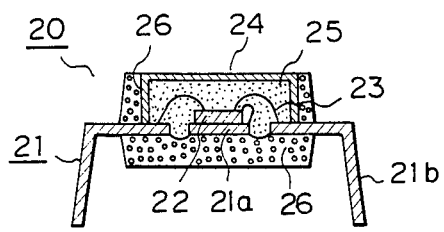
FIG. 4 is a cross-sectional view of an EPROM IC device encapsulated in a plastic-moded package according to the present invention.

FIG. 4 shows in cross section an EPROM IC device manufactured in accordance with the present invention.

As shown in FIG. 4, an EPROM IC chip 22 is secured by a dice bonding process to the surface of a chip mounting portion 21a of an IC lead frame 21. The IC chip 22 has pad electrodes connected by gold wires to leads 21b of an IC lead frame 21.

A cover member 24 made of a material capable of passing ultraviolet rays therethrough is disposed on the IC lead frame 21 in surrounding relation to the IC chip 22 and the gold wires. The material of the cover member 24 may be quartz, alumina, or synthetic resin, for example.

The cover member 24 has therein a resin region 25 capable of passing ultraviolet rays therethrough. The resin region 25 is made of JCR-6127 (manufactured by Toray Co., Ltd.), for example.

The IC lead frame 21 and the cover member 24 are surrounded by an epoxy-resin region 26.

The EPROM IC device, designated 20, of the foregoing construction allows information stored in the IC chip to be erased by ultraviolet rays radiating the surface of the EPROM IC chip 22 through the upper surface of the cover member 24.

FIG. 5 is a cross-sectional view of a process of manufacturing the EPROM IC device according to the present invention.

Figure 5A:
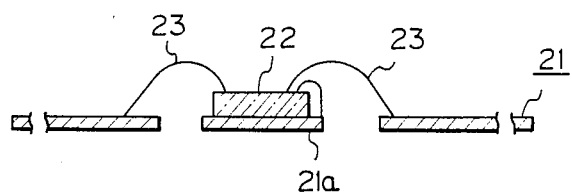
FIGS. 5(A–C) is a cross-sectional veiw showing a process of molding an EPROM IC chip in a plastic package according to the present invention.

In FIG. 5(a), a chip mounting region 21a and an IC lead frame 21 including a plurality of leads are prepared. An EPROM IC chip 22 is mounted on the surface of the chip mounting region 21a by die bonding, using an Au - Si eutectic crystal or a resin paste. Then, pad electrodes of the IC chip 22 and the leads are interconnected by thin metal wires 23 of gold or aluminum.

Figure 5B:
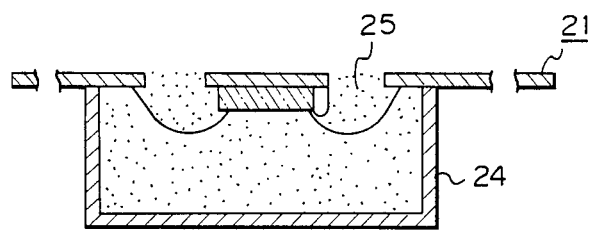

As illustrated in FIG. 5(b), a cover member 24 made of a material capable of passing ultraviolet rays therethrough and having an upper opening is prepared. Then, the IC lead frame 21 with the IC chip 22 mounted thereon is placed on the cover member 24 with the IC chip 22 and the metal wires 23 disposed in the cover member 24. The cover member 24 is made of quartz, alumina, or synthetic resin, and is in the form of a rectangular or circular box. Thereafter, a resin material 25 capable of passing ultraviolet rays therethrough is filled in the cover member 24 through gaps between the leads of the IC lead frame 21, and then is allowed to harden.

Figure 5C:
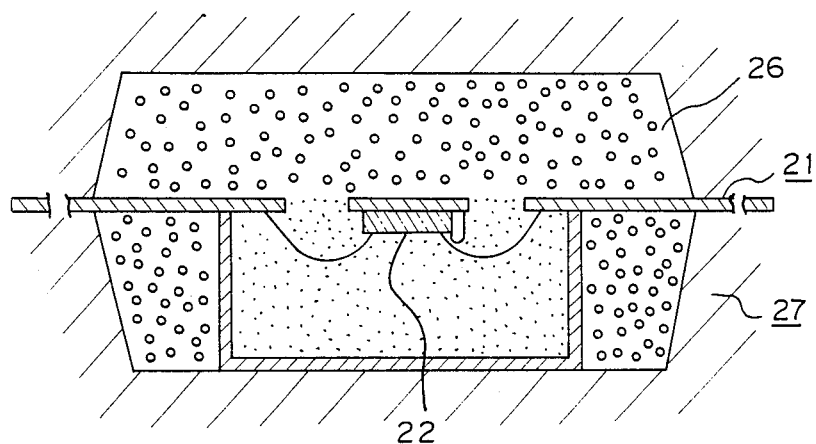

As illustrated in FIG. 5(c), the structure produced by the steps shown in FIGS. 5(a) and 5(b) is set in a mold 27. Then, an epoxy-resin material 26 is introduced under compression into the mold 27 and solidified to form a plastic-molded IC package. In the step of FIG. 5(c), care should be exercised not to cover the upper surface or bottom of the cover member 24 with the epoxy-resin material 26. Should the epoxy-resin material 26 cover the upper surface of the cover member 24, it could easily be removed by a flushing of the alumina powder.

According to the foregoing method of manufacturing EPROM IC devices, an encapsulating container having a window for passing ultraviolet rays therethrough can be molded of a plastic material or synthetic resin introduced under compression. The method lends itself to mass production of EPROM IC devices, and makes it possible to lower the cost of the manufacturing process.

The manufacturing method of the present invention can produce lightweight and shock-resistant plastic-molded packages having ultraviolet-ray transmitting windows.

Although a certain preferred embodiment has been shown and described, it should be understood that many changes and modifications may be made therein without departing from the scope of the appended claims.

What is claimed is:

1. A method of manufacturing an EPROM IC device, comprising the steps of:
   (a) preparing an IC lead frame having a chip mounting region and a plurality of leads;
   (b) fixing an EPROM IC chip on a surface of said chip mounting region;
   (c) connecting pad electrodes of said EPROM IC chip to the leads of said IC lead frame with thin metal wires;
   (d) covering both the EPROM IC chip and the metal wires with a hollow container through which ultraviolet rays can pass, said container being made of a material selected from the group consisting of quartz, alumina and synthetic resins;
   (e) introducing a resin material which is capable of passing ultraviolet rays therethrough into said container to cure said resin material by heating and produce an assembled structure with the EPROM chip held in said container with the cured resin;
   (f) placing said structure obtained by the steps above in a mold; and
   (g) encapsulating said structure, except the bottom surface of said container, with an epoxy resin material in said mold.

2. A method according to claim 1, in which said hollow structure is a retangular container.

* * * * *